US009324489B2

(12) United States Patent
Fontana, Jr. et al.

(10) Patent No.: US 9,324,489 B2
(45) Date of Patent: Apr. 26, 2016

(54) THIN FILM INDUCTOR WITH EXTENDED YOKES

(71) Applicant: International Business Machines Corporation, Armonk, NY (US)

(72) Inventors: Robert E. Fontana, Jr., San Jose, CA (US); Philipp Herget, San Jose, CA (US)

(73) Assignee: International Business Machines Corporation, Armonk, NY (US)

( * ) Notice: Subject to any disclaimer, the term of this patent is extended or adjusted under 35 U.S.C. 154(b) by 47 days.

(21) Appl. No.: 14/230,116

(22) Filed: Mar. 31, 2014

(65) Prior Publication Data

US 2015/0279546 A1 Oct. 1, 2015

(51) Int. Cl.

| | |
|---|---|
| ***H01F 5/00*** | (2006.01) |
| ***H01L 27/08*** | (2006.01) |
| ***H01L 21/8234*** | (2006.01) |
| ***G11B 5/17*** | (2006.01) |
| ***H01F 27/28*** | (2006.01) |

(52) U.S. Cl.
CPC .... *H01F 27/2804* (2013.01); *H01F 2027/2809* (2013.01)

(58) Field of Classification Search
CPC ... H01F 17/0013; H01F 41/042; H01F 5/003; H01F 27/2804; H01L 25/0657; H01L 2924/14; H01L 2924/19042; H01L 2924/30107
USPC ........... 336/200, 177, 234; 257/531; 438/238, 438/381; 360/123.18, 113
See application file for complete search history.

(56) References Cited

U.S. PATENT DOCUMENTS

| | | | | |
|---|---|---|---|---|
| 5,097,243 | A * | 3/1992 | Zieren | G11B 5/3126 323/360 |
| 5,757,522 | A * | 5/1998 | Kulick | G02F 1/136277 359/23 |
| 5,886,959 | A * | 3/1999 | Bischoff | G11B 7/122 369/13.23 |
| 6,445,271 | B1 * | 9/2002 | Johnson | H01F 17/0033 257/531 |
| 7,205,876 | B2 * | 4/2007 | Lee | H01F 17/0013 336/200 |
| 8,089,155 | B2 * | 1/2012 | Lin | H01L 23/522 257/758 |
| 8,102,236 | B1 | 1/2012 | Fontana, Jr. et al. | |
| 2005/0068144 | A1 | 3/2005 | Miettinen | |
| 2008/0123222 | A1 | 5/2008 | Daughton et al. | |
| 2008/0238602 | A1 | 10/2008 | Schrom et al. | |
| 2010/0302662 | A1 | 12/2010 | Toba et al. | |
| 2012/0105187 | A1 | 5/2012 | Lin | |

FOREIGN PATENT DOCUMENTS

| | | |
|---|---|---|
| DE | 3414581 A1 | 10/1985 |
| DE | 3926571 C1 | 4/1990 |

OTHER PUBLICATIONS

"Developments in Integrated On-Chip Inductors with Magnetic Yokes", Abstract #3407, Honolulu PRiME 2012, Copyright 2012 The Electrochemical Society.

* cited by examiner

*Primary Examiner* — Alexander Talpalatski
*Assistant Examiner* — Joselito Baisa
(74) *Attorney, Agent, or Firm* — David B. Woycechowsky

(57) ABSTRACT

A thin film inductor with top and bottom pole pieces that are mechanically connected to each other at at least two via zones, to create a magnetically permeable yoke that defines at least one interior space. Enclosed portion(s) of a winding member pass through the interior space(s) of the yoke. The enclosed portion(s) of the winding member define an axial direction and a transverse direction. The pole pieces extend beyond the via zones in the axial and/or transverse direction. The extended pole pieces improve magnetic performance of the thin film inductor, by effectively moving pole piece edges away from locations of high magnetic flux density.

12 Claims, 4 Drawing Sheets

THIN FILM INDUCTOR WITH EXTENDED YOKES

BACKGROUND OF THE INVENTION

The present invention relates to thin film inductors (see definition of "thin film inductor," below) and more particularly to thin film inductors having ferromagnetic yokes (sometimes herein referred to as "yoke portions" or "pole portions").

The integration of inductive power converters onto silicon, by using fabrication techniques developed for integrated circuits, has reduced the cost, weight, and size of electronics devices. For example, one challenge to developing a fully integrated "on silicon" power converter is the development of high quality thin film inductors. To be viable, the inductors should have a high Q, a large inductance per unit volume and per unit of footprint area, have low energy losses (also called high energy efficiency) and a large energy storage per unit area.

Thin film magnetic inductors typically include: (i) a ferromagnetic bottom yoke portion formed as a thin film layer laid on top of a base portion (for example, a silicon substrate layer); (ii) a ferromagnetic top yoke portion formed as a thin film layer; (iii) magnetic via zones, which are paths of low magnetic reluctance between the bottom pole portion and top pole portion (see definition of "magnetic via zone," below for a more precise definition); and (iv) a current carrier portion (for example, a portion of a spiral winding or a stripline conductor) that passes between the top and bottom yoke portions with respect to the vertical direction and between the via zones with respect to the horizontal direction. The low reluctance paths of the via zones may be formed by: (i) shaping the top and bottom pole pieces so they come into contact (or at least close proximity) in the via zones; or (ii) providing dedicated via portions, made of magnetically permeable material) that serve as a bridge for magnetic flux between the top and bottom yoke portions.

SUMMARY

According to an aspect of the present invention, there is a thin film inductor where a stacking direction of the layers of the thin film structure defines a vertical direction. The inductor includes: (i) a rectangular bottom yoke portion; (ii) a rectangular top yoke portion; (iii) a magnetic via zone set including at least a first magnetic via zone and a second magnetic via zone (with each magnetic via zone of the magnetic via zone set being structured, sized, shaped, connected and/or located to form a low magnetic reluctance path between the top yoke portion and the bottom yoke portion); and (iv) a first current carrier portion. The first magnetic via zone and the second magnetic via zone are elongated in an axial direction. The first magnetic via zone and the second magnetic via zone are spaced apart in a transverse direction by a distance W. At least a portion of the first current carrier portion is located to pass between: (a) the top yoke portion and the bottom yoke portion, and (b) the first via zone and the second via zone. The first and second yoke portions, the first current carrier portion and the first set of via zones are located, sized, shaped and/or connected to act as an inductor when current passes through the first current carrier portion. Each of the top and bottom yoke portions have: (a) a first axial end terminating in a first transverse edge, and (b) a second axial end terminating in a second transverse edge. At least one of the first transverse edge of the top yoke, the second transverse edge of the top yoke, the first transverse edge of the bottom yoke, the second transverse edge of the bottom yoke is spaced apart from the first and second via zones in the axial direction by at least 0.5 times W.

According to a further aspect of the present invention, there is a thin film inductor where a stacking direction of the layers of the thin film structure defines a vertical direction. The inductor includes: (i) a rectangular bottom yoke portion; (ii) a rectangular top yoke portion; (iii) a magnetic via zone set (including at least a first magnetic via zone and a second magnetic via zone, and with each magnetic via zone of the magnetic via zone set being structured, sized, shaped, connected and/or located to form a low magnetic reluctance path between the top yoke portion and the bottom yoke portion); and (iv) a first current carrier portion. The via zones of the magnetic via zone set are elongated in an axial direction and at least substantially aligned with each other in the axial direction. The via zones of the magnetic via zone set are spaced apart from each other in a transverse direction by a distance W. The via zones of the magnetic via zone set each have a transverse direction width L. The first and second yoke portions, the first current carrier portion and the first set of via zones are located, sized, shaped and/or connected to act as an inductor when current passes through the first current carrier portion. Each of the top and bottom yoke portions have: (i) a first transverse end terminating in a first axial edge, and (ii) a second transverse end terminating in a second axial edge. At least one of the first axial edge of the top yoke, the second axial edge of the top yoke, the first axial edge of the bottom yoke, the second axial edge of the bottom yoke is spaced apart from a closest via zone of the via zone of the magnetic via zone set in the transverse direction by at least L.

According to a further aspect of the present invention, there is a thin film inductor where a stacking direction of the layers of the thin film defines a vertical direction. The inductor includes: (i) a rectangular bottom yoke portion; (ii) a rectangular top yoke portion. (iii) a magnetic via zone set (including a plurality of magnetic via zones, with each magnetic via zone of the magnetic via zone set being structured, sized, shaped, connected and/or located to form a low magnetic reluctance path between the top yoke portion and the bottom yoke portion); (iv) a first current carrier portion; and (v) a first electrical via. The via zones of the magnetic via zone set are elongated in an axial direction and at least substantially aligned with each other in the axial direction. The via zones of the magnetic via zone set are spaced apart from each other in a transverse direction. The first and second yoke portions, the first current carrier portion and the first set of via zones are located, sized, shaped and/or connected to act as an inductor when current passes through the first current carrier portion. The top yoke portion includes a first axial end terminating in a first transverse edge. The bottom yoke portion includes a first axial end terminating in a first transverse edge. The first transverse edges of the top and bottom yoke portions are offset from each other to define a gap footprint. The first electrical via extends in the vertical direction. The first electrical via is electrically connected to the first current carrying portion. A footprint of the first electrical via is located at least substantially within the gap footprint.

DETAILED DESCRIPTION

Figure 1:
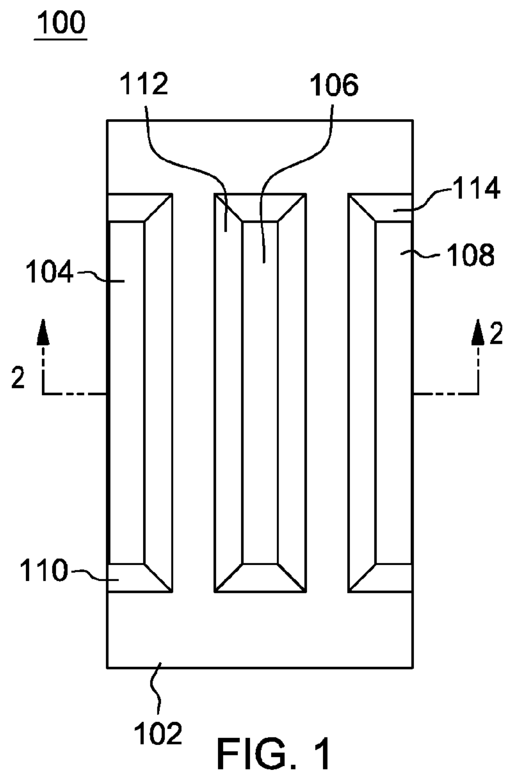
FIG. 1 is an orthographic top view of a first embodiment of a thin film inductor according to the present invention.

Some embodiments of the present invention recognize the following facts, potential problems and/or potential areas for improvement with respect to the current state of the art: (i) longer thin film inductors have better performance in terms of magnetic losses, quality factor, and saturation behavior; (ii) this improved behavior is believed to be due to a proportionately greater portion of edge area on smaller inductor devices; (iii) due to the shape of the magnetic poles, "closure domains" (that is, small ferromagnetic magnetic flux domains whose position and orientation ensure that the flux lines between larger magnetic flux domains in the vicinity close on themselves) may form at the edges of the top and bottom yoke portions; (iv) these closure domains exhibit behavior that differs from that of the material in the center of the device and may degrade performance; and (v) physical properties, such as edge roughness and defects, may also degrade magnetic performance at the yoke portion edge areas of a thin film inductor device.

Some embodiments of the present invention may include one, or more, of the following features, characteristics and/or advantages: (i) a thin film inductor where the top and/or bottom yoke portion extends out beyond the via zones in an "axial direction" (that is, the direction of the current flow in the current carrier portion); (ii) a thin film inductor where the top and/or bottom yoke portions extend out beyond the via zones in the "transverse direction" (that is, normal to the axial direction); (iii) a thin film inductor that places the edges of yoke portions containing the closure domains and other magnetic defects away from the areas with high field concentrations; and/or (iv) a thin film inductor with reduced loss and better saturation characteristics.

As shown in FIGS. 1 to 4, thin film inductor 100 includes: top yoke portion 102; baked photoresist 103; first via zone 104; second via zone 106; third via zone 108; spiral winding member (or, more simply, winding) 120; bottom yoke portion 122 base layer 123. Top yoke portion 102 includes first transition portion 110; second transition portion 112; and third transition portion 114. In this embodiment, there are three (3) depressions in the top yoke portion defined by transition portions 110, 112, 114 sloping downward so that the top yoke portion meets the bottom yoke portion to create via zones 104, 106, 108. In this way, as best shown by reviewing FIGS. 2 and 3 together, both elongated portions of winding 120 are enclosed in the interior space between the top and bottom yoke portions. It is noted that many embodiments (as in many conventional thin film inductors) will have an overcoat layer located over the top surface of top yoke portion 102, but this overcoat layer is not shown in FIGS. 1 to 4 for better clarity of illustration reasons.

Many variations on this geometry are possible, such as: (i) more or fewer turns of the spiral current carrier portion; (ii) a flat top yoke portion, with the bottom yoke portion being contoured upward to make the meetings in the via zones; (iii) contours in both the top and bottom yoke portions so that the via zones occur at a height of the center plane of the winding member; (iv) via zones created using intermediate discrete fabricated portions that are not part of the top yoke portion of the bottom yoke portion; and/or (v) other current carrier geometries (such as a stripline current carrier portion).

Figure 3:
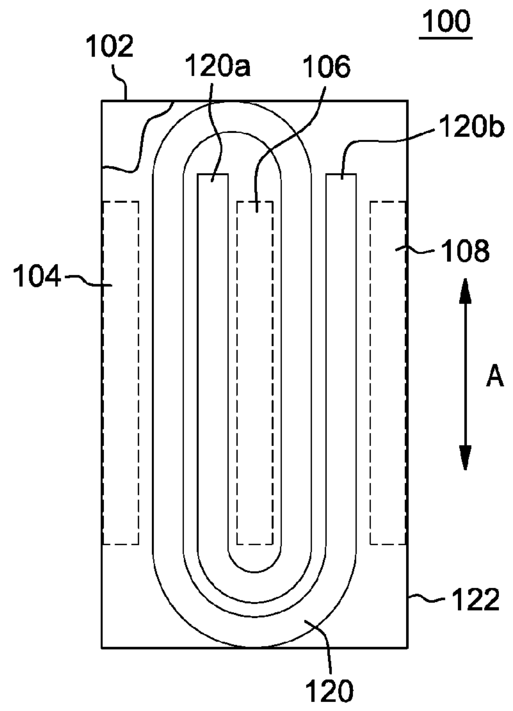
FIG. 3 is an orthographic top view of the first embodiment inductor with its top pole piece removed.
Figure 2:
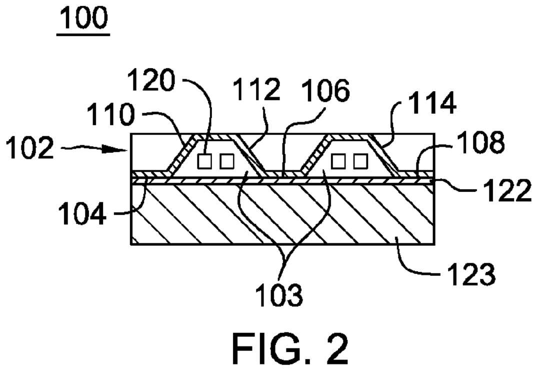
FIG. 2 is a cross-sectional view of the first embodiment computer inductor, with the section being as indicated by the section lines in FIG. 1.

As shown in FIGS. 1 and 3, the top and bottom yoke extend beyond via zones 104, 106, 108 in direction A, which is the direction of elongation of the portions of winding member 120 enclosed in the yoke formed by yoke portions 102 and 122. For this reason, inductor 100 can be described as having an axially extended yoke. In this way, and as shown by the magnetic domain lines and magnetic field lines in FIG. 4, the extended yoke design of inductor 100 effectively moves the location of the yoke edges containing the closure domains and other magnetic defects out to an area of the yoke structure (specifically the axially extended portions that lay beyond the footprint created by the three via zones 104, 106, 108) having lower magnetic fields.

Figure 4:
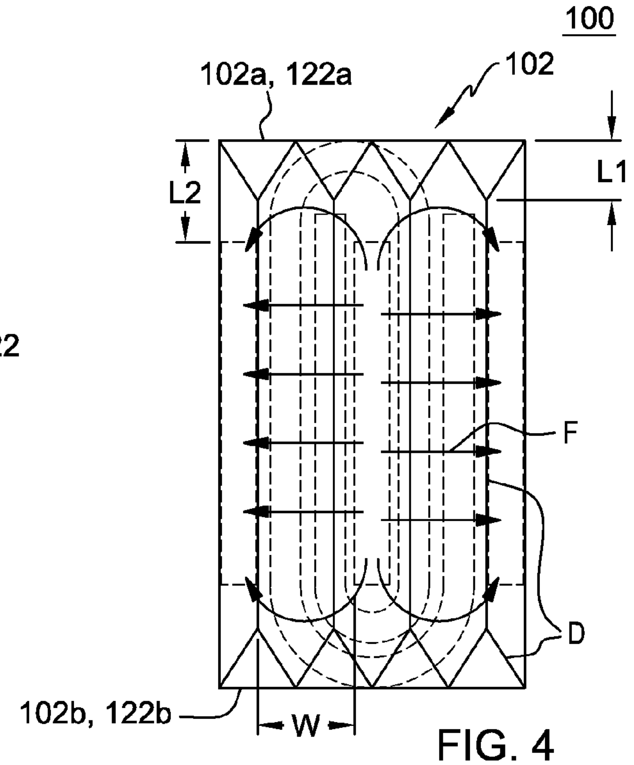
FIG. 4 is an orthographic top view of the first embodiment inductor with its top pole piece made transparent and with lines of magnetic flux shown.

As shown in FIG. 4, domain walls D and approximate field pattern lines F are generated in the axially extended yoke portions 102, 122 of inductor 100. In axially extended yoke 102, 122, magnetic flux density is much lower outside the footprint created by via zones 104, 106, 108. This is generally favorable with respect to performance and efficiency because the edge effects (see discussion of edge effects, above) that occur in the transverse direction (that is, normal to arrow A) edges of the yoke portions do not coincide with a space having large flux density (as indicated by flux lines F).

As those of skill in the art will appreciate, electrical current paths will generally be provided from the ends 120*a*, 120*b* of winding member 120 so that current can flow through the inductor and be subject to electrical induction. In typical inductor configurations, these ends connect to the electrical circuitry that is located either above or below the plane of the inductor. The connection is made by using an electrical via, or bond pad. However, as can be seen from FIG. 3, access to the winding ends 120*a* and 120*b* are now blocked by the extended top yoke portion 102 or bottom yoke portion 122. There are a number of options for making these connections as will be described in the following embodiments. The simplest solution is to extend the coil turns such in the top portion of FIG. 3, so that the outer top turn and both the coil ends 120*a* and 120*b* lie outside of the yoke structure. This method however has the disadvantage that the coil becomes longer, which increases resistance and decreases Q. In another embodiment, only one of the two poles is extended in the upward direction. For example, if only the top pole is extended, and the bottom pole is left short, electrical vias are easily made in the downward direction with the coil configuration of FIG. 3. In yet another embodiment, a hole can be created in one of the two yokes to provide access to the coil. Due to its potential impact on magnetic performance, this hole could be placed in a region where the magnetic fields are low, for example above the center via 106. This way, the magnetic closure domains formed around the hole will be located in an inactive portion of the yoke.

In any of these embodiments, the top pole is shaped and contoured by being formed on a hard baked photoresist 103 which encapsulates the enclosed portions of the winding member. More specifically, this photoresist has a top portion that includes sloping portions. In inductor 100, when the top yoke is deposited, it is located directly on top of: (i) the bottom yoke portion (for the via zones 104, 106, 108); and (ii) the baked photoresist (for all portions outside of the via zones). Other methods of encapsulating the windings may also be used, as would be known to someone skilled in the art.

In inductor 100, the top and bottom yoke portions 102, 122 are formed as deposited conformal magnetic films. Typical inductors use plated materials such as permalloy or other compositions of nickel and iron, however other ferromagnetic materials and deposition techniques may be employed as would be known to someone skilled in the art. In alternate embodiment a laminated stack of alternating magnetic layers and electrically insulative layers may be used for each of the poles. These laminated stacks have the advantage of reducing eddy current losses.

Figure 5:
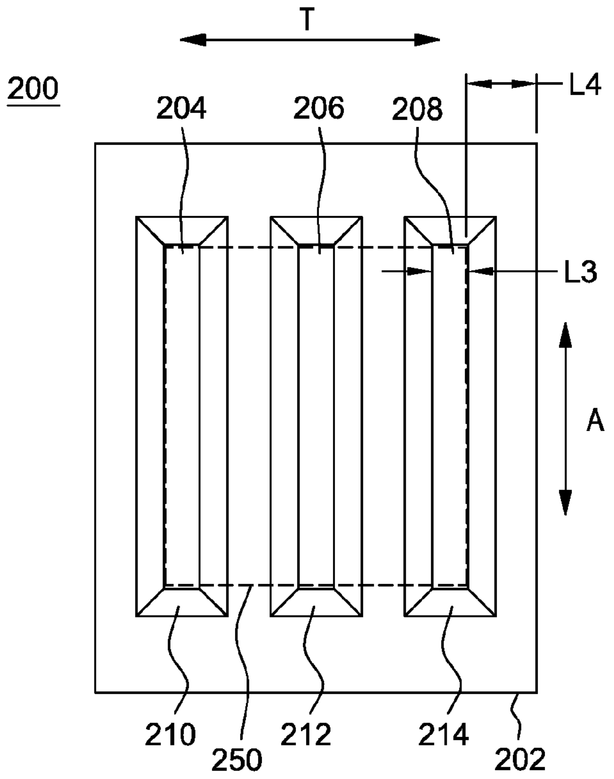
FIG. 5 is an orthographic top view of a second embodiment of a thin film inductor according to the present invention.

As shown in FIG. 5, thin film inductor 200 includes a yoke that is both: (i) axially extended (direction of arrow A); and (ii) transversely extended (direction of arrow T). More specifically, inductor 200 includes top yoke portion 202; via zones 204, 206 and 208; transition portions 210, 212 and 214; bottom yoke portion (obscured by the top yoke portion in the view of FIG. 5); and current carrier portion (not shown). In FIG. 5, a "single carrier via zone footprint 250" is shown in dotted lines. The single carrier via zone footprint is the footprint, in the plane of the thin film inductor device, that includes all of the via zones associated with a single current carrier portion. In the example of inductor 200, the single carrier is current carrier portion, and the via zones that interact with this current carrier portion are via zones 204, 206, 208. Accordingly, the dotted line is the perimeter around these three zones. Inductor 200 is different than inductor 100, discussed above, because the pole pieces extend past the via zones in the transverse direction T, as well as the axial direction A. This means that unfavorable edge effects, as discussed above, are reduced at both of: (i) the pole piece edges normal to axial direction A; and (ii) the pole piece edges normal to transverse direction T.

Figure 6:
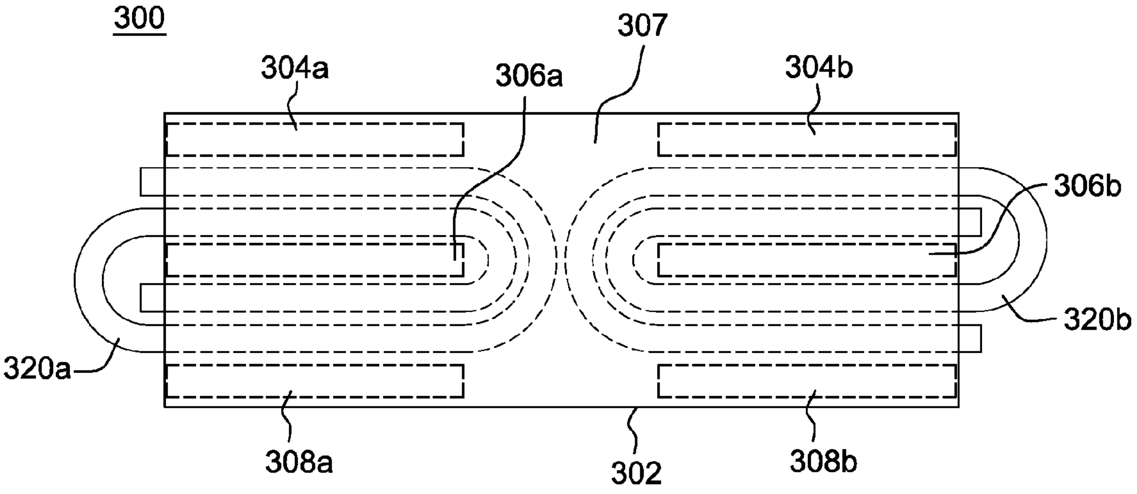
FIG. 6 is an orthographic top view of a third embodiment of a thin film inductor according to the present invention.

As shown in FIG. 6, thin film inductor 300 (see definition of "inductor," regarding inductors with multiple current carriers) includes: top yoke portion 302; first winding member 320*a*; second winding member 320*b*; and bottom yoke portion (obscured by the top yoke portion in the view of FIG. 6). In inductor 300, the bottom yoke portion is shaped and contoured to define via zones 304*a*, 304*b*, 306*a*, 306*b*, 308*a*, and 308*b*. In FIG. 6, both the top and bottom yoke portions are sized and shaped to be coextensive with an "aggregate via zone footprint," and the yokes do not extend past the aggregate via zone footprint of inductors 200. The aggregate via zone footprint is the footprint, in the plane of the thin film inductor devices, that includes all of the via zones associated with all of the current carrier portions of inductors 200. In the example of inductor 300, there are two current carrier portions 320*a, b* (which are spiral shaped current carriers in this example), and the via zones that, collectively, interact with this set of carriers are via zones 304 *a, b*, 306 *a, b* and 308 *a, b*.

Inductor 300 is an example of a thin film inductor that: (i) includes multiple current carriers; (ii) includes multiple sets of magnetic vias, with each set of magnetic vias being respectively associated with a current carrier; (iii) defines a single carrier via zone footprint for each set of vias; and (iv) includes top and bottom yokes that extend over a space that is between single carrier via footprints (specifically, intermediate region 307).

In this embodiment and as shown in FIG. 6: (i) the for first winding member 320*a*, the yoke extends in the axial direction beyond its via zones 304*a*, 306*a*, 308*a*, but only on the side facing the second winding member 320*b*; and (ii) the for second winding member 320*b*, the yoke extends in the axial direction beyond its via zones 304*b*, 306*b*, 308*b*, but only on the side facing first winding member 320*a*. Inductor 300 eliminates the two sets of closure domains normally found at the yoke edges. Inductor 300 allows free access to both ends of both winding members 320*a* and 320*b*. Alternatively, even more winding members could be added between two common pole pieces.

Figure 7:
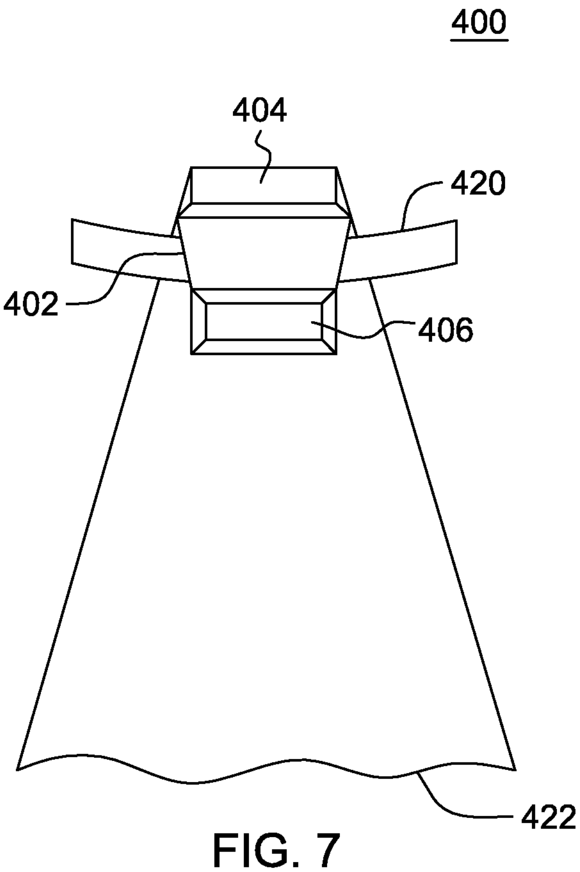
FIG. 7 is an orthographic top view of a fourth embodiment of a thin film inductor according to the present invention.

As shown in FIG. 7, thin film inductor 400 includes: top yoke portion 402; arc-shaped stripline current carrier 420; and bottom yoke portion 422. Top yoke portion 402 is shaped and/or contoured to define via zones 404 and 406. Inductor 400 is designed to give an idea of just some of the scope and/or variations that the present invention may have, such as: (i) the winding member is not a spiral; (ii) the portion of the winding member that passes through the yoke interior space is not linear, but, rather, shaped as an elliptical arc (although the enclosed winding portion does still effectively define an axial and transverse direction; (iii) the pole piece is not symmetrical; (iv) the extended yoke area of the bottom yoke portion is much larger than the area of the via zones; (v) the top yoke is not substantially extended at all; (vi) there is only a single interior space defined by the set of via zones 404, 406 that are defined by the top and bottom yoke portions; (vii) only two via zones and/or (viii) the edges of the pole piece are not necessarily normal to either of the axial or transverse directions. Furthermore, with respect to item (vii) in the preceding list, the edge(s) of the yoke portion need not be linear at all (for example, a pole piece with a circular footprint).

A method of making one embodiment of thin film inductor according to the invention will now be discussed.

Step (i): provide a "base portion." This may be a simple monolithic substrate, or it may include multiple layers and electronic components. This step is similar to the provision of a base portion for fabricating a conventional thin film inductor.

Step (ii): deposit and/or pattern a resist mask on the top surface of the base portion. The resist mask extends around and defines a rectangular area where the bottom yoke portion will later be located. This step is similar to the provision of a resist mask for use in defining the size and shape of a bottom yoke portion of a conventional thin film inductor, except that the rectangular unmasked space will extend further in the axial and/or transverse directions than it would for a comparable conventional thin film conductor.

Step (iii): the bottom yoke is electroplated inside the unmasked area defined by the resist mask. This step is similar to the way a bottom yoke portion is provided in a conventional thin film inductor.

Step (iv): the resist mask is removed. This step is similar to the fabrication process for a conventional thin film inductor.

Step (v): a thin insulation layer (in this example, a silicon oxide layer) is deposited on the top surface of the bottom yoke portion. This step is similar to the fabrication process for a conventional thin film inductor.

Step (vi): a current carrier portion (in this example, a spiral coil shaped current carrier) is electroplated onto the top surface of the insulation layer. This step is similar to the fabrication process for a conventional thin film inductor.

Step (vii): via regions are formed by coating an organic insulation layer (in this example, a photoresist layer) over the entire structure. This step is similar to the fabrication process for a conventional thin film inductor.

Step (viii): the photoresist layer is partially removed by photo-exposure. More specifically, in the via zones, where the top and bottom yokes are going to come into contact to make a magnetic via, the photoresist layer is removed. This step is similar to the fabrication process for a conventional thin film inductor, except that the via zones will be offset from the edges of the bottom yoke in at least one of the following two directions: (i) the axial direction; and/or (ii) the transverse direction. To put it a slightly different way, there will be some photoresist that remains: (a) between the short edges of the via zones and the corresponding edge of the bottom yoke; and/or (b) between the outer elongated edges of the via zone and the corresponding edges of the bottom yoke.

Step (ix): the remaining photoresist layer is developed and then baked at a high temperature to harden the remaining portion of the photoresist layer. The photo-exposure process makes permanent the location of what will become the via regions after the top yoke portion is put into place. As mentioned above, the outer vias are positioned so that they lie inside the extent of the bottom yoke portion.

Step (x): etching is used to remove the thin insulation in the via regions. More specifically, the thin insulation layer will largely be covered by the photoresist layer, but, in the via regions, the top surface of the thin insulation layer will be exposed by the previous partial removal of the photoresist layer at step (viii). In this example, step (x) is a reactive ion etch process. This step is similar to the fabrication process for a conventional thin film inductor, except for the placement of the via regions relative to the footprint of the bottom yoke.

Step (xi): deposit and/or pattern a second resist mask on the top surfaces of the photoresist layer. The second resist mask extends around and defines a rectangular area where the top yoke portion will later be located. This step is similar to the provision of a second resist mask for use in defining the size and shape of a top yoke portion of a conventional thin film inductor, except that the rectangular unmasked space will extend further in the axial and/or transverse directions than it would for a comparable conventional thin film conductor.

Step (xii): the top yoke is electroplated inside the unmasked area defined by the second resist mask. This unmasked area will include: (a) via regions where the top yoke portion is plated directly on top of the bottom yoke portion; and (b) non-via regions (including "extended yoke portions") where the top yoke is electroplated over the top surface of the hardened photoresist layer. This step is similar to the way a top yoke portion is provided in a conventional thin film inductor.

Step (xiii): the second resist mask is removed. This step is similar to the fabrication process for a conventional thin film inductor.

Step (xiv): other conventional post-processing, such as providing an overcoat layer on the top surface of the top yoke portion.

A further aspect of some embodiments of the present invention will now be discussed in detail. This aspect relates to the distance that the yoke extends outside the footprint, and how a designer can ensure that an extended yoke is extended sufficiently far enough to substantially improve inductor performance.

First, the amount of extension will be discussed with reference to embodiments having an axial direction extension, like inductor 100 of FIGS. 1 to 4, discussed above. Turning attention to FIG. 4, the domain walls D are located substantially along the inward, axial direction (that is, direction A as shown in FIG. 3) edges of the magnetic vias, except in the vicinity of transverse edges 102*a*, 122*a*, 102*b*, 122*b* of the top and bottom yoke portions. In the vicinity of transverse edges 102*a*, 122*a*, 102*b*, 122*b* of the top and bottom yoke portions, and as shown in FIG. 4, the domain walls D split (that is, make the triangle patterns shown in FIG. 4). These splits in the domain pattern lines represent "closure domains." In embodiments of the present invention with axially-extended yokes, these closure domains should be far enough away from the axial ends of the magnetic vias such that flux density (shown by flux lines F) is small in the yoke areas occupied by the closure domains. The source and sink for the flux are the vias on either side of the yoke. With an extended yoke, the footprint of the relatively high density flux bows out into the extended space, but the flux density diminishes with the length of the arc. This is why the axial extensions of some embodiments of the present invention can be effective to move the transverse edges of the yoke into a low flux density area, but, because of the "bowing" of the flux lines the yokes need to extend beyond the axial ends of the magnetic vias by more than a minimal amount.

The size of the closure domains depends on material properties. For example, there might be many small "triangles" instead of four big ones at each transverse edge of the yoke, as shown in FIG. 4. However, regardless of the size of the "triangles," some embodiments of the present invention are designed to keep the flux level low at the transverse yoke edges (or at least some of the transverse yoke edges—see discussion, below, relating to electric vias).

Because the magnetic domain lines at least roughly align with the inward-facing, axial direction edges of magnetic vias, the transverse direction width W (see FIG. 4) of the opening between two magnetic vias largely determines: (i) the maximum distance between a pair of domain walls D; and, consequently (ii) the axial direction length L1 (see FIG. 4) of the closure domains at the axial ends of the yoke. This is not to say that the axial length L1 of the closure domain will be equal to the transverse width W of the opening between an opposing pair of magnetic vias. Rather, it is believed that these values L1 and W are, at least roughly, correlated in some way such that the transverse width W of the opening can serve as a useful scaling factor for the length of axial yoke extensions L2 (see FIG. 4) beyond the axial ends of the magnetic vias. In some embodiments of the present invention, at least one yoke member (top or bottom) will extend, at at least one axial end, beyond the proximate axial end of the magnetic via pair(s) by at least 0.5 times the transverse width of the opening between the magnetic vias of the magnetic via pair(s). In some embodiments of the present invention, at least one yoke member (top or bottom) will extend, at at least one axial end, beyond the proximate axial end of the magnetic via pair(s) by at least 1.0 times the transverse width of the opening between the magnetic vias of the magnetic via pair(s).

The greater the axial extension (that is, the greater L2 is), the lower the flux density at the transverse edge (for example, transverse edge 122*a*) of the yoke member. The lower the flux density at the transverse edge, the better the performance of the inductor. However, the marginal drop in flux density with increased extension length is believed to diminish, especially as the axial extension L2 becomes greater than 0.5 times the transverse width W.

The interplay between axial extensions and electric vias (that is, vertical current carrying members that carry current into and/or out of the current carrying member of the thin film inductor) will now be briefly revisited. Some embodiments of the present invention: (i) have some yokes extended in the axial direction; but (ii) leave at least one yoke unextended in the axial direction so that an electrical via can extend in the vertical direction up (or down) to an end of the current carrying member without the need for the current carrier to pass through a yoke layer. It was mentioned above that, in some embodiments of the present invention, an electrical via does pass through a yoke. However, the electric via must be electrically isolated from the yoke through which it vertically extends, which may prove difficult to fabricate reliably and/or reduce the magnetic performance of the yoke in some thin film inductor applications. In the embodiments which are the focus of these paragraphs: (i) there is an upper and lower yoke; (ii) one of the yokes is substantially axially extended (that is, extended more than 0.5 times the width a magnetic via pair) at at least one of its transverse ends; (iii) while the other yoke is not substantially axially extended at its corresponding transverse end which defines a gap footprint between the transverse ends of the two yokes; and (iv) a first electric via extends vertically from outside of the thin film inductor to a current carrying member of the thin film inductor within the gap footprint and without passing through either yoke.

Figure 8:
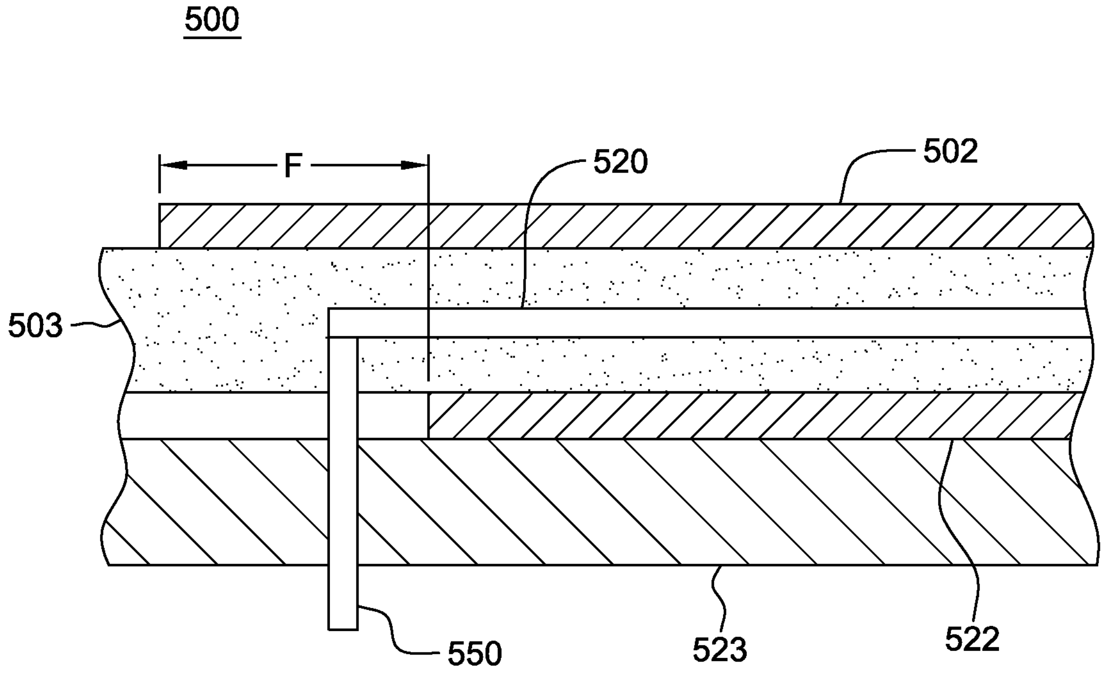
FIG. 8 is an axial cross sectional view of a fifth embodiment of a thin film inductor according to the present invention.

As shown in FIG. 8, thin film inductor 500 includes a pair of yokes where one yoke is substantially axially extended and the other end is not substantially axially extend to create a gap footprint that accommodates an electric via. More specifically, inductor 500 includes: top yoke 502; support material 503; current carrying member 520; bottom yoke 522; substrate 523; and vertically-extending electric via 550. In inductor 500, the top yoke is substantially axially extended, while the bottom yoke is not substantially axially extended, so that there is a gap footprint F between the transverse ends of the top and bottom yokes. Note that electric via 550 extends vertically to meet current carrying member 520 within the profile of the gap footprint, and thereby avoids any need to pass through the bottom yoke.

Moving now from axial direction yoke extensions to transverse direction yoke extensions, according to some embodiments of the present invention, the transverse extension (see FIG. 5 at dimension L4) is greater than the transverse width of the magnetic via (see FIG. 5 at L3).

The following paragraphs set forth some definitions.

Present invention: should not be taken as an absolute indication that the subject matter described by the term "present invention" is covered by either the claims as they are filed, or by the claims that may eventually issue after patent prosecution; while the term "present invention" is used to help the reader to get a general feel for which disclosures herein that are believed as maybe being new, this understanding, as indicated by use of the term "present invention," is tentative and provisional and subject to change over the course of patent prosecution as relevant information is developed and as the claims are potentially amended.

Embodiment: see definition of "present invention" above—similar cautions apply to the term "embodiment."

and/or: inclusive or; for example, A, B "and/or" C means that at least one of A or B or C is true and applicable.

Electrically Connected: means either directly electrically connected, or indirectly electrically connected, such that intervening elements are present; in an indirect electrical connection, the intervening elements may include inductors and/or transformers.

Mechanically connected: Includes both direct mechanical connections, and indirect mechanical connections made through intermediate components; includes rigid mechanical connections as well as mechanical connection that allows for relative motion between the mechanically connected components; includes, but is not limited, to welded connections, solder connections, connections by fasteners (for example, nails, bolts, screws, nuts, hook-and-loop fasteners, knots, rivets, quick-release connections, latches and/or magnetic connections), force fit connections, friction fit connections, connections secured by engagement caused by gravitational forces, pivoting or rotatable connections, and/or slidable mechanical connections.

Vertical/horizontal: for purposes of convenient reference, vertical and horizontal references (or "up" and "down" or "top" and "bottom") are used herein based on a convention that the substrate underlies the yokes and current carrier, which effectively defines the "vertical" and "horizontal;" while this convenient convention is used in this document, it will be understood by those of skill in the art that the thin film inductors of the present invention, like conventional thin film inductors, may be susceptible to fabrication and/or use such that the "vertical" direction is not aligned with the direction of Earth's gravitational field.

Inductor: as used herein, a single "inductor" may include more than one electrically independent current carrier, so long as there is a common top yoke and/or a common bottom yoke.

Thin film inductor: any inductor made with integrated circuit fabrication techniques; integrated circuit fabrication techniques include, but are not limited to, various types of deposition (for example, sputter deposition), various types of material removal (for example, planarization, etch processes), various types of patterning (for example, photolithography), etc.

Magnetic via zone: is a low reluctance path between a top and bottom yoke portion that is in proximity to at least one current carrier portion; a magnetic via zone may take the form of a part separate from the top and bottom yokes, or it may simply be a zone where the bottom surface of the top yoke and the top surface of the bottom yoke come into contact (or at least close proximity); for example, a single magnetic via zone may serve two independent current carriers if the via is in proximity to both current carriers; as a further example, the top and bottom yokes may come into direct physical contact, without creating a "magnetic via zone" because the zone over which the two top and bottom yokes come into contact is not in proximity to a current carrier and, consequently, electromagnetic interaction with the current carrier would not cause significant magnetic flux density through the contact zone.

Magnetic via zone set: all of the magnetic via zones associated with a single independent current carrier; a single magnetic via zone may belong to more than one magnetic via zone set.

What is claimed is:

1. A thin film inductor where a stacking direction of the layers of the thin film structure defines a vertical direction, the inductor comprising:

a rectangular bottom yoke portion;

a rectangular top yoke portion;

a magnetic via zone set including at least a first magnetic via zone and a second magnetic via zone, with each magnetic via zone of the magnetic via zone set being structured, sized, shaped, connected and/or located to form a low magnetic reluctance path between the top yoke portion and the bottom yoke portion; and a first current carrier portion;

wherein:

the first magnetic via zone and the second magnetic via zone are elongated in an axial direction;

the first magnetic via zone and the second magnetic via zone are spaced apart in a transverse direction by a distance W;

at least a portion of the first current carrier portion is located to pass between: (i) the top yoke portion and the bottom yoke portion, and (ii) the first via zone and the second via zone;

the first and second yoke portions, the first current carrier portion and the first set of via zones are located, sized, shaped and/or connected to act as an inductor when current passes through the first current carrier portion;

each of the top and bottom yoke portions have: (i) a first axial end terminating in a first transverse edge, and (ii) a second axial end terminating in a second transverse edge; and at least one of the first transverse edge of the top yoke, the second transverse edge of the top yoke, the first transverse edge of the bottom yoke, the second transverse edge of the bottom yoke is spaced apart from the first and second via zones in the axial direction by at least 0.5 times W.

2. The inductor of claim 1 wherein:

the first transverse edge of the top yoke and the second transverse edge of the top yoke are both spaced apart from the first and second via zones in the axial direction by at least 0.5 times W.

3. The inductor of claim 1 wherein:

the first transverse edge of the top yoke and the second transverse edge of the top yoke, the first transverse edge of the bottom yoke are all spaced apart from the first and second via zones in the axial direction by at least 0.5 times W; and the second transverse edge of the bottom yoke is spaced apart from the first and second via zones in the axial direction by less than 0.5 times W.

4. The inductor of claim 1 wherein:

at least one of the first transverse edge of the top yoke, the second transverse edge of the top yoke, the first transverse edge of the bottom yoke, the second transverse edge of the bottom yoke is spaced apart from the first and second via zones in the axial direction by at least 1.0 times W.

5. The inductor of claim 1 wherein:

the first and second via zones are each defined by locations where the top and bottom yoke are in contact with each other.

6. The inductor of claim 1 wherein:

the first and second via zones each include magnetically permeable material extending vertically from the top yoke portion down to the bottom yoke portion.

7. The inductor of claim 1 wherein:

the magnetic via zone set further includes a third via zone; and the first current carrier portion includes a first portion located between the first and second magnetic via zones and a second portion located between the first and third magnetic via zones.

8. A thin film inductor where a stacking direction of the layers of the thin film structure defines a vertical direction, the inductor comprising:

a rectangular bottom yoke portion;

a rectangular top yoke portion;

a magnetic via zone set including at least a first magnetic via zone and a second magnetic via zone, and with each magnetic via zone of the magnetic via zone set being structured, sized, shaped, connected and/or located to form a low magnetic reluctance path between the top yoke portion and the bottom yoke portion; and a first current carrier portion;

wherein:

the via zones of the magnetic via zone set are elongated in an axial direction and at least substantially aligned with each other in the axial direction;

the via zones of the magnetic via zone set are spaced apart from each other in a transverse direction by a distance W;

the via zones of the magnetic via zone set each have a transverse direction width L;

the first and second yoke portions, the first current carrier portion and the first set of via zones are located, sized, shaped and/or connected to act as an inductor when current passes through the first current carrier portion;

each of the top and bottom yoke portions have: (i) a first transverse end terminating in a first axial edge, and (ii) a second transverse end terminating in a second axial edge; and at least one of the first axial edge of the top yoke, the second axial edge of the top yoke, the first axial edge of the bottom yoke, the second axial edge of the bottom yoke is spaced apart from a closest via zone of the via zone of the magnetic via zone set in the transverse direction by at least L.

9. The inductor of claim 8 wherein:

the first axial edge of the top yoke and the second axial edge of the top yoke are each spaced apart from a closer via zone of the magnetic via zone set in the transverse direction by at least L.

10. The inductor of claim 8 wherein:

the via zones of the magnetic via zone set are each defined by locations where the top and bottom yoke are in contact with each other.

11. The inductor of claim 8 wherein:

the via zones of the magnetic via zone set each include magnetically permeable material extending vertically from the top yoke portion down to the bottom yoke portion.

12. The inductor of claim 8 wherein:

the magnetic via zone set includes at least a first, a second and a third magnetic via zone; and the first current carrier portion includes a first portion located between a first magnetic via zone of the set of magnetic via zones and a second magnetic via zone of the set of magnetic via zones and a second portion located between the first magnetic via zone and third via zones.

* * * * *